United States Patent [19]

Moore et al.

[11] Patent Number: 5,600,255
[45] Date of Patent: Feb. 4, 1997

[54] LIVE CIRCUIT RESISTANCE MEASUREMENT SYSTEM AND METHOD

[75] Inventors: John H. Moore, Alameda; Christopher J. Revak, Pleasanton, both of Calif.

[73] Assignee: Electro-Test, Inc., Danville, Calif.

[21] Appl. No.: 560,846

[22] Filed: Nov. 20, 1995

[51] Int. Cl.⁶ .......................... G01R 27/08; G01R 31/00
[52] U.S. Cl. .......................... 324/715; 324/537; 324/705; 324/713; 324/718; 361/86
[58] Field of Search ........................ 324/511, 537, 324/705, 713, 715, 718; 361/60, 86, 88, 91

[56] References Cited

U.S. PATENT DOCUMENTS

| | | | |
|---|---|---|---|
| 4,278,931 | 7/1981 | Huggins | 324/523 |
| 4,808,914 | 2/1989 | Talmor | 324/705 |
| 4,963,830 | 10/1990 | Roth et al. | 324/715 |
| 5,006,809 | 4/1991 | Mang et al. | 324/715 |
| 5,057,772 | 10/1991 | Bruno et al. | 324/537 X |
| 5,424,894 | 6/1995 | Briscall et al. | 361/86 X |
| 5,495,178 | 2/1996 | Cheng | 324/713 X |

*Primary Examiner*—Kenneth A. Wieder
*Assistant Examiner*—Glenn W. Brown
*Attorney, Agent, or Firm*—Limbach & Limbach L.L.P.

[57] ABSTRACT

A method and apparatus for measuring the electrical resistance of a circuit energized with AC power. The invention imposes a known DC current in the circuit under test and senses a resulting DC voltage drop that corresponds to the resistance of the circuit. The invention senses AC overvoltage conditions in the circuit under test and electrically isolates the measuring circuit from the circuit under test.

16 Claims, 3 Drawing Sheets

LIVE CIRCUIT RESISTANCE MEASUREMENT SYSTEM AND METHOD

BACKGROUND OF THE INVENTION

The present invention relates to the testing of the power connections for electrical distribution equipment by measurement of the resistance of the connection path.

Electrical distribution equipment degrades with time and usage. Thermal cycling of the equipment eventually causes connections to loosen. Also, oxidation due to high current levels and exposure to air causes the conductivity of the power connections to erode and eventually fail. Unplanned outages caused by power system failure represent costly interruptions of service. Connection failure may also contribute to safety hazards for personnel and property damage due to fire.

Avoiding unplanned outages leads to improved equipment reliability and minimizes downtime. Preventative maintenance programs are employed to attempt to identify potential failures before they occur and schedule a planned outage for repair. Cost/benefit analysis has shown that a scheduled maintenance outage can cost far less than an unscheduled service interruption.

Nonetheless, the cost of preventative maintenance can become significantly expensive. Methods for preventative maintenance requiring a planned shutdown of the system result in lost productivity while the equipment is out of service. Other methods relying on infrared inspection of electrical connections for heating related to degraded conductivity require access that is unavailable in covered areas. Also, infrared inspection may be ineffective if load current is not high enough to produce detectable levels of heat. Routine bolt tightening methods are also inadequate when areas are covered and increase the incidence of breakage in the system.

To reduce the cost and improve the reliability of system maintenance, it is advantageous to be able to directly test the resistance of energized power connections. However, conventional ohm-meters are not designed to measure the resistance of live circuits and may be damaged or present a serious safety hazard if used for such a purpose.

SUMMARY OF THE INVENTION

The problems discussed above are solved in the present invention which is a system that measures the resistance of a portion (e.g., a power bus connection) of a live power circuit. The invention operates by imposing a direct current (DC) of known magnitude between probes that are connected across the part to be measured, while the part is energized with periodically varying power (typically alternating current (AC) at 60-Hz). The resistance is obtained from a measured DC voltage drop by virtue of Ohm's Law.

In a preferred embodiment, the invention includes a voltmeter connected to a measuring apparatus whose probes are placed in contact across the part to be tested (typically, a same phase power connection). In one preferred embodiment, one probe is a C-clamp to be clamped onto the part to be tested, the other probe is an insulated hand held stylus. In other preferred embodiments, each probe is an insulated hand held stylus. Alternatively, other types of probes can be used. The probes are attached by conductive cables to terminals of the measuring apparatus. When at least one probe is a stylus, the stylus preferably incorporates a normally open magnetic reed switch and a normally open test switch. When both switches are closed, two isolation relays in the measurement apparatus are actuated thereby completing the electrical path from the point of the stylus to the measuring apparatus.

In a typical operation (when each probe is a hand held stylus), one probe is held against the bus to be tested. The other probe is then placed at some distance from the first probe on the same bus. The resistance path that is to be measured is the region of the bus between the two probes. Each probe is pressed against the bus causing two spring loaded contacts in each probe to move back into the body of the probe. This action causes a small magnet on one of the contacts to close a magnetic reed switch enabling the test switch. Depressing the test switch on the probes actuates the isolation relays completing the circuit from the measuring apparatus across the power connection under test.

A controlled current source within the measuring apparatus injects a known current into the test circuit. A differential amplifier measures the voltage drop between the test probes which corresponds to the resistance of the connection under test. The measured voltage is amplified by a selectable gain value and displayed by the attached voltmeter.

If the probes are inadvertently connected across different power phases or between a power phase and ground, then a lockout circuit compares the AC voltage across the probe terminals and, when the voltage exceeds the selected threshold, disables relays in the measurement apparatus to isolate the test circuitry and activate an alarm and indicator light in one of the probes. The alarm signal also turns on a panel alarm in the measuring apparatus.

When an overvoltage condition occurs after a measurement has been initiated, a triac between the probe terminals acts as a crowbar circuit which, when the triac is activated by the presence of AC voltage at the current contacts, shunts the AC current through a protective fuse causing the fuse to open, thereby avoiding damage to the constant current source circuitry of the apparatus. Similarly, a transient voltage suppressor, comprised of back-to-back zener diodes, provides protection for the measurement circuit by shunting AC voltage surges thereby causing a protective fuse to open.

BRIEF DESCRIPTION OF THE DRAWINGS

The features and advantages of the live circuit resistance measurement according to the present invention will be more clearly understood from the following description taken in conjunction with the accompanying drawings in which.

DETAILED DESCRIPTION OF THE PREFERRED EMBODIMENT

In a preferred embodiment, the live bus resistance measurement system of the invention is a low resistance measurement system utilizing the 4-wire Kelvin technique to measure resistance from 2 milliohms to 200 milliohms full scale, with 1 microhm resolution on conductors energized up to 480 VAC.

Figure 1:
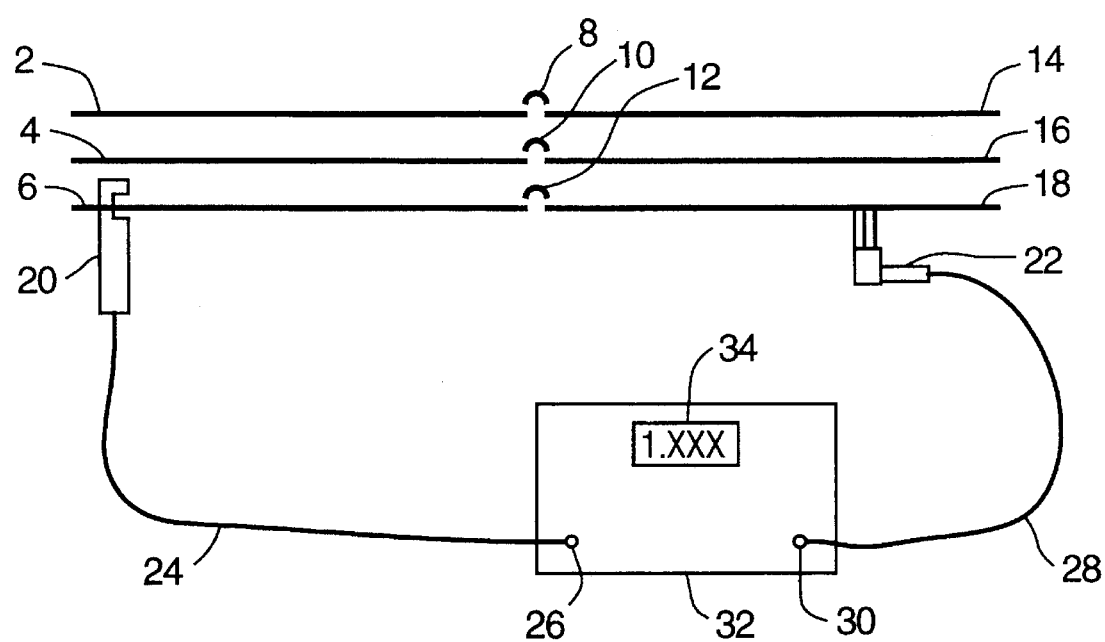
FIG. 1 is a diagram of the measuring device of the invention connected across an energized circuit under test.

The measuring system is shown attached to a power circuit under test in FIG. 1. The three phases of the line side power busses 2, 4 and 6 of the power bus system are shown connected to the three phases of the load side power busses 14, 16 and 18 with power connectors 8, 10 and 12. A combined current and potential probe 20 is shown in contact with line side bus 6 with another combined current and potential probe 22 in contact with the load side bus 18 of the same power phase. Probe 20 is attached to measurement unit 32 by conductive cable 24 attached to terminal 26. Similarly, probe 22 is attached to terminal 30 of measurement unit 32 by conductive cable 28. When configured as shown in FIG. 1, the measurement unit 32 will measure the resistance of power connection 12 (between bus 6 and bus 18). The measured resistance will be displayed on readout 34.

The FIG. 2 embodiment will be described in the context that probe 22 (including contacts 46 and 48) and probe 20 (including contacts 35 and 37) thereof are connected to a part to be measured as shown in FIG. 1. In operation, the FIG. 2 apparatus applies a 1 amp constant current across the unknown resistance of the power connection via current contacts 37 and 46. The DC voltage developed across this resistance is detected by potential contacts 35 and 48. This DC voltage directly relates to the value of the unknown resistance which is then scaled by the resistance measurement circuit 100 and displayed by panel meter 102 (which corresponds to readout 34 of FIG. 1). Mechanical switches 36 and 52, magnetic reed switches 38 and 44, and AC voltage lock-out circuit 136 are employed to prevent a resistance measurement from being initiated when an AC voltage is sensed between the measurement points that is above a preset threshold (which will be assumed to be 10 VAC in the example described). The AC voltage is displayed on panel meter 102, and an audible panel alarm 134, an audible alarm 40, and LED 42 in one of the measurement probes, are actuated when the sensed AC voltage exceeds the threshold. If the AC voltage between the measurement points increases above 5 VAC after a resistance measurement has been initiated, protective fusing 60, 64 and 86 and crow bar circuits 68 and 108 provide protection for the instrument should the AC voltage lock-out circuit 136 not respond in time relative to the AC voltage sensed. The live bus resistance measurement system operates from a 6 volt lead acid battery 90, providing total system power from a single source.

The voltage from battery 90 is applied directly to the DC constant current source 78, relays 128 and 130, the "Test" LED 132 and the primary side of DC to DC converter 96 (which is a 5 volt to isolated ±12 volt DC to DC converter). The DC to DC converter 96 isolates the constant current source power from the measurement circuit 100, AC voltage display circuit 118 and AC voltage lock-out circuit 136. The secondary of DC to DC converter 96 also powers a +5 volt regulator 94 and a −5 volt regulator 92 used by the measurement circuit 100, AC voltage display circuit 118 and AC voltage lock-out circuit 136.

The DC constant current source 78 is powered by battery 90 and comprises voltage reference 76, operational amplifier 84, field effect transistor (FET) 82 and a 0.1 ohm resistor 80. FET 82 is operated in its ohmic region wherein the current passing through the transistor is linearly related to the voltage at the transistor gate terminal. A stable 0.100 VDC reference voltage is obtained by scaling down the output voltage from reference 76 and is applied to the non-inverting input of amplifier 84. The resistance of resistor 80 is 0.1 ohms so that a constant current of 1 ADC through FET 82 results in a 0.100 VDC drop across resistor 80. This voltage drop is input to the inverting input of amplifier 84. The feedback signal obtained from resistor 80 controls the output of amplifier 84 which drives the gate of FET 82 and maintains the current flow through FET 82 at 1 ADC. In this way, the circuit maintains a constant current of 1 ADC in the loop formed by battery 90, FET 82, the 0.1 ohm resistor 80 and the unknown resistance of the circuit under test between current contacts 37 and 46.

The voltage developed by the 1 ADC current source across the unknown resistance is sensed by potential contacts 35 and 48, and is applied to the differential inputs of instrumentation amplifier 106. Amplifier 106 isolates the current source circuit 78 from the measurement circuit 100 and provides selectable gains in decade steps from 10 to 1000. This allows a measurement of 200 millivolts DC full scale to 2 millivolts DC full scale which directly corresponds to 2 ohms full scale to 2 milliohms full scale. The output of amplifier 106 is then conditioned by 10 Hz low pass filter 104. The output of filter 104 is output to meter 102, a 2 VDC full scale input 3½ digit panel meter with a transfer function of 1 ohm–1 volt (in the sense that, in response to a voltage of 1 VDC output from 104, meter 102 produces a display of 1 ohm).

AC voltage lock-out circuit 136 performs a lockout function which isolates the measurement circuit 100 and inhibits the application of the constant current source 78 to the resistance to be measured if the AC voltage sensed across the resistance exceeds a preset level (which is typically approximately 10 VAC). This is done to preclude damage to the measurement circuit 100 and the current source 78, which is a low impedance circuit, from the application of line level AC voltage.

An AC voltage appearing across current contacts 37 and 46 of the measurement probes is scaled by divider 110 (which is preferably a 1000:1 divider) giving a transfer function of 1 VAC=1 mVAC. This is then converted by true RMS converter 112 to a DC voltage, with an input of 1 mVAC to circuit 112 producing an output of 1 mVDC. The DC voltage of the output of circuit 112 is then buffered by amplifier 114 (of display circuit 118) which is configured as a voltage follower. This voltage level is then displayed on a 2 volt full scale, 3½ digit panel meter 120 (of display circuit 118) as a representative AC voltage, 1 mVDC=1 VAC.

The AC voltage lock-out function is performed by the current contacts 37 and 46, magnetic reed switches 38 and 44, "Test" switches 36 and 52, the divider 110, RMS converter 112, X10 amplifier 116, comparator 122, transistor 124, solid state relay driver 126, relay 128, relay 130, relay contacts 54, 56, 62, and 70, panel alarm 134, probe alarm 40, and LED 42. To make a measurement, the probes 20 and 22 are placed on the part (typically a power bus) to be tested. The probe contacts 35, 37, 46 and 48 are spring loaded and must be depressed to actuate the magnetic reed switches 38 and 44. This ensures that the AC voltage lock-out circuit 136 has time to monitor the test for any AC voltage before allowing the test current to be injected on to the bus. The "Test" switches 36 and 52 on each probe are then depressed and the measurement is completed.

Under normal circumstances the AC voltage across the bus under test is very low, less than a couple volts, due to the extremely low resistance of the bus. This voltage appears across the 1000:1 divider 110 which is then applied to the RMS converter 112. The output of RMS converter 112 is routed to amplifier 116, configured as a X10 amplifier with a transfer function of 1 VAC sensed=10 mVDC. This voltage is then applied to the input of comparator 122. If this voltage is less than 100 mVDC, which represents 10 VAC, the output of comparator 112 remains high. This biases transistor 124 to the on state. With transistor 124 on, relay driver 126 can be actuated by depressing "Test" switches 36, 52 on the probes (if switches 38, 44 are also closed, in response to pressing the contacts 37 and 46 to the part being tested). With driver 126 on, relays 128 and 130 are pulled in closing relay contacts 54, 56, 62, and 70 thus completing the measurement circuit 100 and the current source circuit 78 and illuminating the "Test" LED 126. If the AC voltage sensed exceeds 10 VAC (or another preset value, in variation on the FIG. 2 embodiment), the output of comparator 122 goes low, biasing off transistor 124, turning on the panel alarm 134 and the probe LED 42 and alarm 40. With transistor 124 off, relay driver 126 can not be turned on, relays 128 and 130 will not be actuated and the current and measurement circuits will remain isolated by the open relay contacts 54, 56, 62, and 70.

If an AC voltage greater than 5 VAC is placed across the potential contacts 35 and 48 after the relay contacts 54, 56, 62, and 70 have been closed, then the overvoltage between the contacts is shunted by a crowbar protection circuit that includes capacitor 66 and triac 68. Capacitor 66 will sense the AC voltage and bias triac 68 to the on state. With triac 68 on, a virtual short is placed across current contacts 35 and 48 which causes fuse 64 to open. Diode 72 provides blocking protection for the parasitic reverse bias diode inherent in FET 82. Diode 74, an 8.2 V back-to-back zener diode, provides secondary clamping protection and transient suppression. Diode 108 protects the input of amplifier 106 by clamping voltage greater than 8.2 volts and causing fuse 60 to open.

Figure 2A:
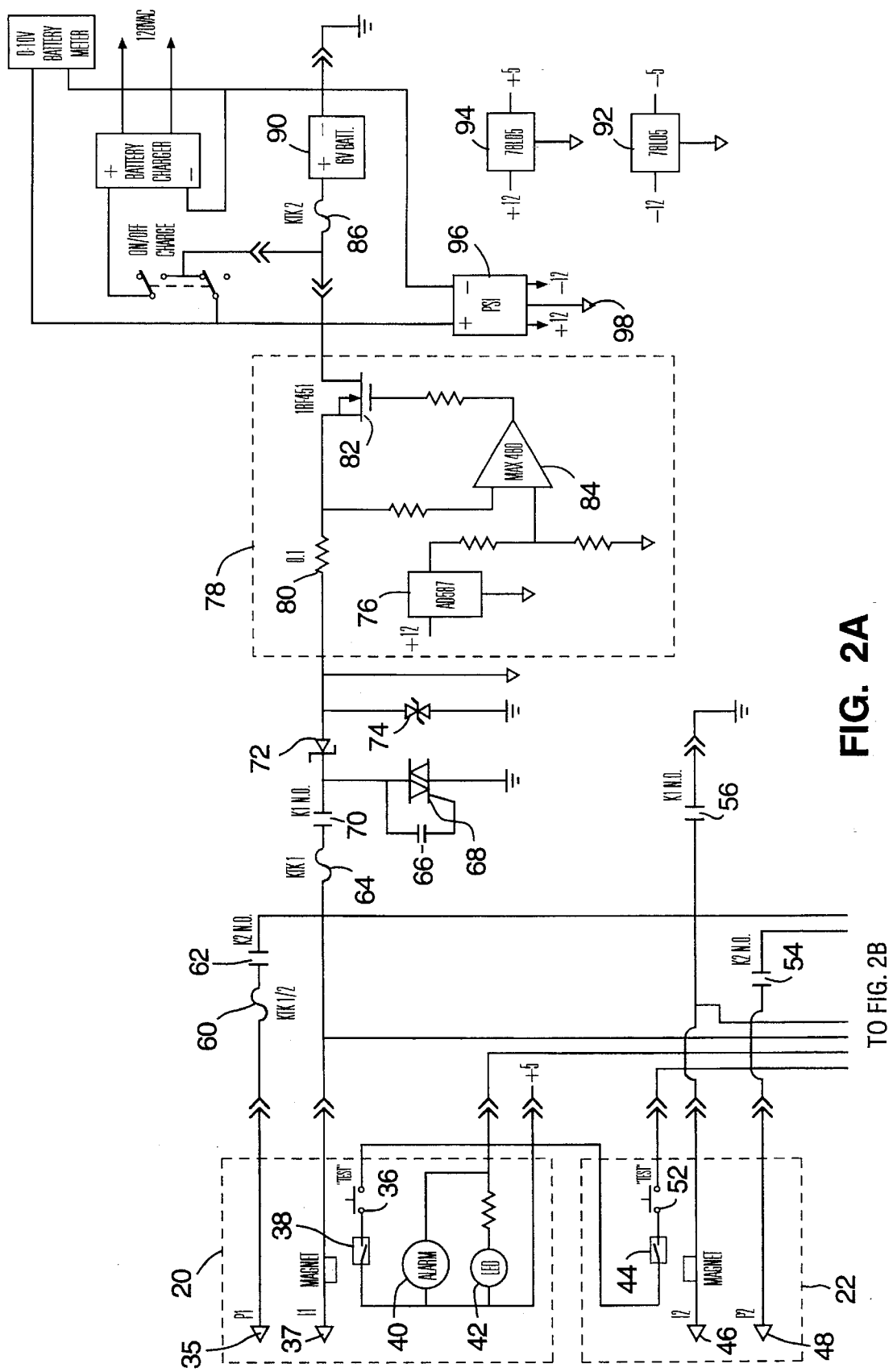
FIG. 2 (which consists of two parts labeled FIG. 2A and FIG. 2B) is a partial schematic diagram of a preferred embodiment of the measuring apparatus of the invention, showing the controlled current source circuit, the resistance measurement circuit, and the AC voltage lock-out circuit.
Figure 2B:
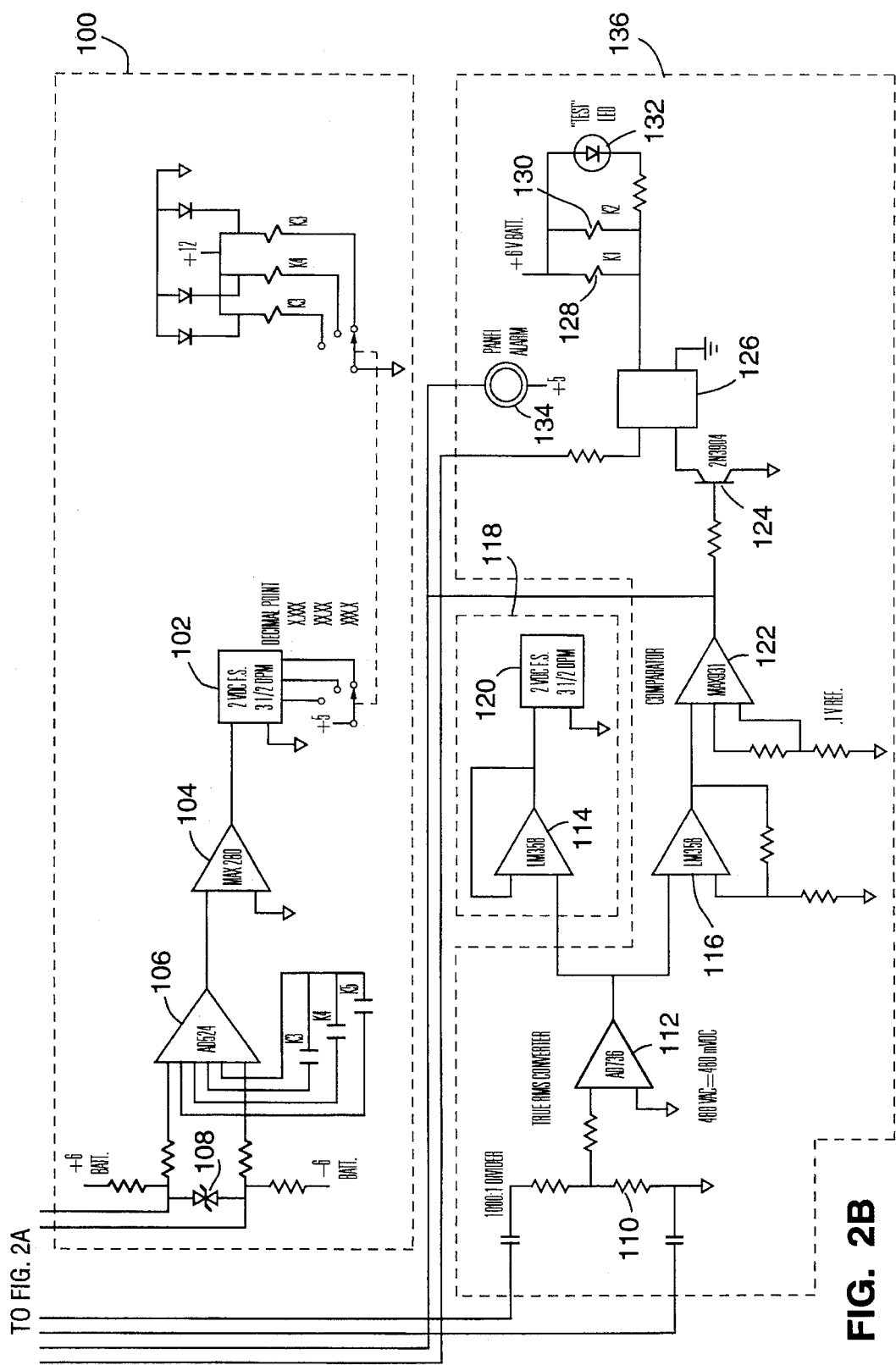

Various modifications of the embodiment in FIG. 2 are possible. The threshold voltage of AC voltage lock-out circuit 136 can be preset to many different values by manipulating the reference voltage to comparator 122. The filtering stage that suppresses the AC component of the voltage signal observed across the potential contacts may be designed with a cut-off frequency of no more than 50 Hz to obtain satisfactory results. In addition, the function circuit can be realized using zener diodes with different threshold values.

Other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A method for measuring resistance of a portion of a circuit energized with alternating current, said method comprising the steps of:

connecting two current contacts to the portion of the circuit under test;

connecting two potential contacts to the portion;

sensing an alternating current voltage level present between the current contacts;

comparing the voltage level to a preset voltage threshold;

electrically isolating the potential contacts and the current contacts from the portion if the voltage level exceeds the threshold;

imposing a direct current of constant magnitude between the current contacts and into the portion;

using an instrumentation amplifier to sense a direct current potential difference between the potential contacts and generate an output signal indicative of the difference.

2. The method of claim 1 wherein the circuit under test is an electric power bus circuit.

3. The method of claim 1, also including the step of low pass filtering the output signal to suppress an alternating current signal present in the output signal.

4. The method of claim 1 wherein the potential contacts are electrically isolated from the portion until after the current contacts are attached to the portion.

5. A resistance measuring device capable of making measurements on a portion of a circuit energized with AC power, said device comprising:

two current contacts for making contact with to the portion;

two potential contacts for contact to the portion;

first means for detecting the AC voltage across the potential contacts, generating a first signal indicative of the amplitude of the AC voltage, comparing the first signal to a threshold value, and generating a second signal in response to the first signal exceeding the threshold value;

a means for electrically isolating the current contacts from the portion in response to the second signal;

a current means for inducing a substantially constant direct current of known magnitude in the portion, when the current contacts are connected to the portion;

a detection means for detecting the DC voltage signal across the potential contacts when the substantially constant direct current is induced in the portion, and transforming the voltage signal into an output signal that is indicative of the resistance of said portion.

6. The device of claim 5 wherein at least one of the current contacts has an activation element, and the activation element electrically isolates said current means from said portion unless said at least one of the current contacts is pressed into contact with said portion.

7. The device of claim 5 wherein the detection means includes at least one filter means for at least partially suppressing any AC voltage component in the output signal.

8. The device of claim 7 wherein the filter means comprises a low pass filter with a cut-off frequency no higher than 50 Hz.

9. The device of claim 5 wherein the detection means includes an instrumentation amplifier.

10. The device of claim 9 wherein the instrumentation amplifier includes means for amplifying the DC voltage signal by a selectable value.

11. The device of claim 5, also including: a single power source for providing power to the current means, the first means, the means for electrically isolating the current contacts, and the detecting means.

12. The device of claim 11 also including: at least one DC to DC voltage converter connected for electrically isolating the single power source from other circuits in the device.

13. The device of claim 5 wherein the current means is a constant current source circuit comprising a field effect transistor operating in its ohmic region and an operational amplifier driving the transistor gate terminal to control the current passing through the transistor.

14. The device of claim 13 wherein the constant current source circuit induces a direct current of 1 Ampere between the current contacts, and wherein the detection means implements a direct 1 Volt to 1 Ohm relationship between the DC voltage signal and the resistance of the portion.

15. The device of claim 5 also including: a crowbar circuit spanning the current contacts, wherein the crowbar circuit shunts AC current between the current contacts when AC voltage across the current contacts rises above a predetermined threshold.

16. The device of claim 5, also including back-to-back zener diodes and a fuse, wherein the back-to-back zener diodes span the current contacts and shunt AC voltage surges above a predetermined threshold through the fuse to protect the current means from damage.

* * * * *